United States Patent
Xu et al.

(10) Patent No.: US 7,352,262 B2
(45) Date of Patent: *Apr. 1, 2008

(54) INSULATION OF ANTI-RESONANCE IN RESONATORS

(76) Inventors: Yong Ping Xu, 113 Clementi Rd., Blk D, #03-02, Singapore 129793 (SG); Wai Hoong Sun, Blk 559, Ang Mo Kio Ave. 10, #04-1840, Singapore 560559 (SG); Xiaofeng Wang, The Middle Minzhu Road, #116, Shangqui City, Henan Province, 476000 (CN); Zhe Wang, BLK 206 Clementi Avenue 6, #10-101, Singapore 120206 (SG); Sean Ian Saxon Liw, Blk 329 Ubi Ave 1, #09-617, Singapore 400329 (SG)

( * ) Notice: Subject to any disclaimer, the term of this patent is extended or adjusted under 35 U.S.C. 154(b) by 0 days.

This patent is subject to a terminal disclaimer.

(21) Appl. No.: 11/492,704

(22) Filed: Jul. 24, 2006

(65) Prior Publication Data

US 2007/0040632 A1    Feb. 22, 2007

Related U.S. Application Data

(63) Continuation of application No. 10/291,633, filed on Nov. 12, 2002, now Pat. No. 7,095,297.

(60) Provisional application No. 60/331,256, filed on Nov. 13, 2001.

(51) Int. Cl.
  *H03H 9/02*    (2006.01)
  *H03M 3/02*    (2006.01)
(52) U.S. Cl. .................. 333/187; 333/193; 333/176; 341/143; 331/154
(58) Field of Classification Search ............ 333/187, 333/193; 341/143; 331/154
See application file for complete search history.

(56) References Cited

U.S. PATENT DOCUMENTS 3,731,230 A * 5/1973 Cerny, Jr. ............ 331/116 R (Continued)

FOREIGN PATENT DOCUMENTS

EP     0740411 A1 * 10/1996

(Continued)

OTHER PUBLICATIONS

Wai-Kai Chen, "Two-Port Synthesis by Ladder Development", 1995 CRC Press, University of Illinois, Chicago, pp. 2276-2291.*

*Primary Examiner*—Barbara Summons
(74) *Attorney, Agent, or Firm*—Berkeley Law and Technology Group, LLP

(57) ABSTRACT

A cancellation circuit to remove the anti-resonance signal from a resonator. Micro-mechanical and surface and bulk acoustic wave resonators include an anti-resonance in an output signal. This has an undesirable effect on certain types of systems in their function and performance. An anti-resonance cancellation circuit removes the anti-resonance from the output of the resonators by providing a signal which is subtracted from the output of the resonator. The cancellation circuit includes a capacitor which is matched to the static capacitance of the resonator. The loads of the resonator and cancellation network are also matched.

18 Claims, 3 Drawing Sheets

U.S. PATENT DOCUMENTS

| | | | |
|---|---|---|---|
| 4,577,168 A * | 3/1986 | Hartmann | 333/170 |
| 4,754,242 A * | 6/1988 | Okamura et al. | 333/175 |
| 5,220,836 A * | 6/1993 | Harms et al. | 73/702 |
| 5,283,578 A * | 2/1994 | Ribner et al. | 341/143 |
| 5,487,015 A * | 1/1996 | White | 702/117 |
| 5,675,296 A * | 10/1997 | Tomikawa | 331/158 |
| 6,292,121 B1 * | 9/2001 | Cake et al. | 341/143 |
| 6,717,482 B2 * | 4/2004 | Sato et al. | 331/154 |
| 7,095,297 B2 * | 8/2006 | Xu et al. | 333/187 |
| 2004/0169437 A1 * | 9/2004 | Orsier et al. | 310/322 |

FOREIGN PATENT DOCUMENTS

| | | | |
|---|---|---|---|
| FR | 2823619 | * | 10/2002 |
| JP | 04-134913 | * | 5/1992 |
| JP | 2001-217649 | * | 8/2001 |
| JP | 2001-268365 | * | 10/2001 |
| JP | 2002-344286 | * | 11/2002 |
| SU | 1109883 | * | 8/1984 |

* cited by examiner

INSULATION OF ANTI-RESONANCE IN RESONATORS

This application is a continuation of U.S. patent application Ser. No. 10/291,633, filed on Nov. 12, 2002, now issued as U.S. Pat. No. 7,095,297. which claims the benefit of U.S. Provisional Application No. 60/331,256, filed Nov. 13, 2001.

This application is also related to U.S. application Ser. No. 10/188,071 filed Jul. 3, 2002, the entirety of which is hereby incorporated by reference.

BACKGROUND OF THE INVENTION

1. Field of the Invention

The present invention generally relates to the cancellation of the anti-resonance signal from a resonator and more particularly to a method and apparatus for cancelling the anti-resonance in micro-mechanical, surface acoustic wave (SAW) and bulk acoustic wave (BAW) resonators.

2. Description of the Background Art

Cellular telephone systems are now used in many countries in the world and have often replaced traditional wired systems. However, in different countries, the specific standards that have been adopted are often different. Thus, cellular devices from one country are not operable within the system in another country. The result is that manufacturers must produce completely different handsets for different countries, which requires the engineering and design of completely different items, which is more expensive than having a single common item which is usable in all countries. One method that has been suggested to overcome this problem is a software-defined radio which utilizes an entire band of RF or IF signal with the particular channel being selected using a programmable digital filter. However, this requires an A/D converter which has a speed in the GHz range and also has a dynamic range over 100 dB. One type of converter which shows promise in performing within these parameters is a signal-delta A/D converter which includes a sigma-delta modulator and a digital filter. An example of such a system is shown in FIG. 1 of related U.S. patent application Ser. No. 10/188,071. The modulator shown there includes a resonator which provides noise shaping.

Communication systems have widely used SAW resonators due to its high Q factor which cannot be achieved by active filters. Recently developed IC compatible micro-mechanical resonators have been used to replace the bulky SAW resonators to further reduce the volume of the system. However, the resonant frequency of micro-mechanical resonators is often limited to hundreds of MHz. However, recent advances in bulk acoustic wave technology has made it possible to use BAW resonators in conventional CMOS technology. These BAW resonators have a higher resonant frequency and are typically in the GHz range.

In all three types of these resonators, there are two modes of resonance, namely the series mode and the parallel mode. In the series mode, the impedance of the resonator is at a minimum. In the parallel mode, the impedance of the resonator is at a maximum. The frequency at which the series resonance occurs is referred to as the resonant frequency while the frequency at which the parallel resonance mode occurs is called the anti-resonant frequency.

FIG. 1 is a graph showing the relationship between the frequency of the resonator and the admittance (inverse of impedance). A maximum point is seen at 1 which is the series resonance mode. This occurs at frequency $f_r$. A minimum point 2 is the parallel resonance mode which occurs at the anti-resonance frequency $f_a$.

FIG. 2 shows a typical equivalent circuit for a resonator. It includes a static capacitance $C_p$, 3 which is connected in parallel to a series circuit of resistor $R_m$, 6, capacitor $C_m$, 5 and inductor $L_m$, 4. The static capacitance 3 alters the transfer function of the ideal resonator by introducing two transmission zeros. In different applications, the presence of the anti-resonance may be desirable, such as in filtering and making oscillators. However, in other situations, it is not desirable such as in the sigma-delta modulator of U.S. patent application Ser. No. 10/188,071 discussed above. The presence of anti-resonance makes it difficult to realize the transfer function of the modulator and therefore it is desirable that it be cancelled. Likewise, in other modulators and in other situations, it may be desirable to cancel the anti-resonance in order that the resonance peak is emphasized.

SUMMARY OF THE INVENTION

Accordingly, one object of this invention is to provide a method for canceling the anti-resonance in resonators.

Another object of this invention is to provide a circuit for the cancellation of anti-resonance in resonators.

A further object of this invention is to provide a method for the cancellation of anti-resonance in micro-mechanical and acoustic wave resonators.

Another object of this invention is to provide a circuit for the cancellation of anti-resonance and micro-mechanical and acoustic wave resonators.

A still further object of this invention is to provide a circuit having a resonator and a cancellation network providing inputs to a subtractor.

A still further object of this invention is to provide a capacitor which acts as the cancellation network for a resonator.

A still further object of this invention is to provide a method and circuit for the cancellation of anti-resonance in micro-mechanical, SAW and BAW resonators.

These and other objects of the invention are obtained by providing a cancellation network having a common input with a resonator and having an output which is subtracted from the output of the resonator to cancel the anti-resonance.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein.

DETAILED DESCRIPTION OF THE PREFERRED EMBODIMENTS

Figure 3:
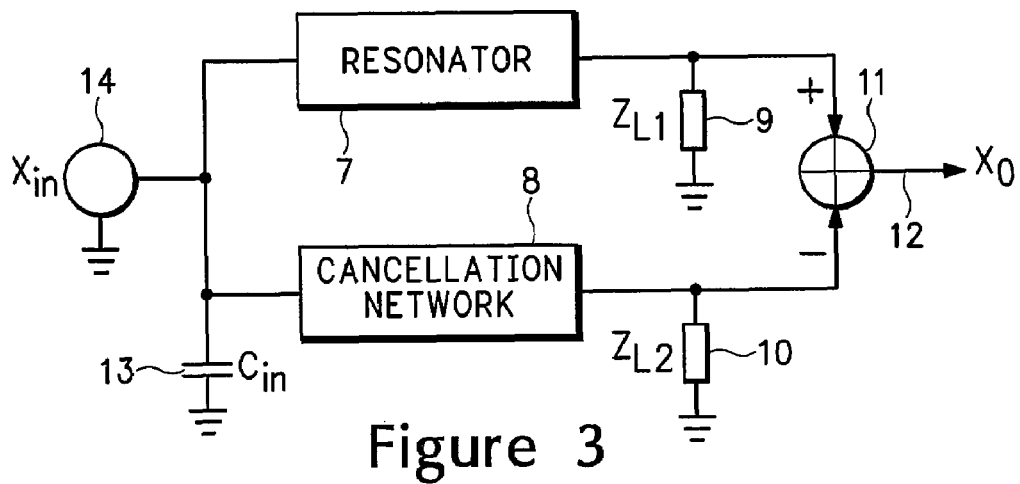
FIG. 3 is a circuit diagram of a first embodiment of the present invention.

Referring now to the drawings, wherein like reference numerals designate identical or corresponding parts throughout the several views, and more particularly to FIG. 3 which shows the system according to the present invention. An input signal from the signal generator $X_{in}$, 14, is applied to both resonator 7 and cancellation network 8. The output of the cancellation network is subtracted from the output of the resonator circuit in the subtractor 11. Lumped loads $Z_{l1}$ 9 and $Z_{l2}$ 10 are provided at the outputs of the resonator and cancellation network, respectively. These consist of the input impedances of the subtractor as well as parasitic impedances at the respective notes. Capacitor $C_{in}$ 13, is a lumped parasitic capacitance at the input node. The output of the subtractor $X_o$, 12, provides a signal with the anti-resonance being removed from the usual resonator output. This is accomplished as long as certain parameters of the cancellation network assume the proper values.

Figure 1:
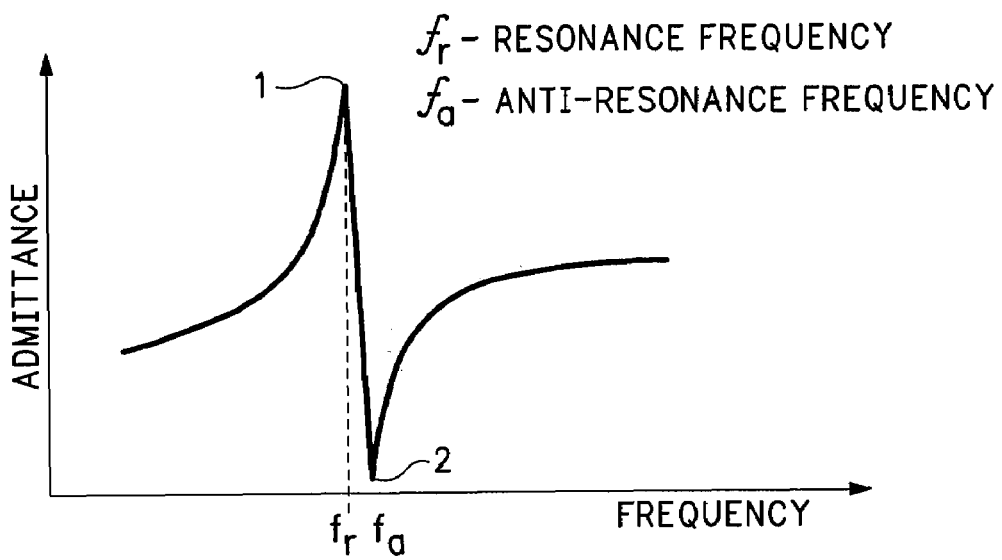
FIG. 1 is a graph illustrating the relationship between frequency and admittance of a resonator.
Figure 2:
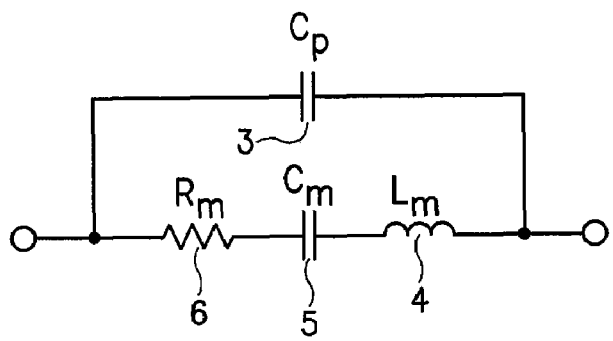
FIG. 2 is an equivalent circuit for a prior art resonator.
Figure 4:
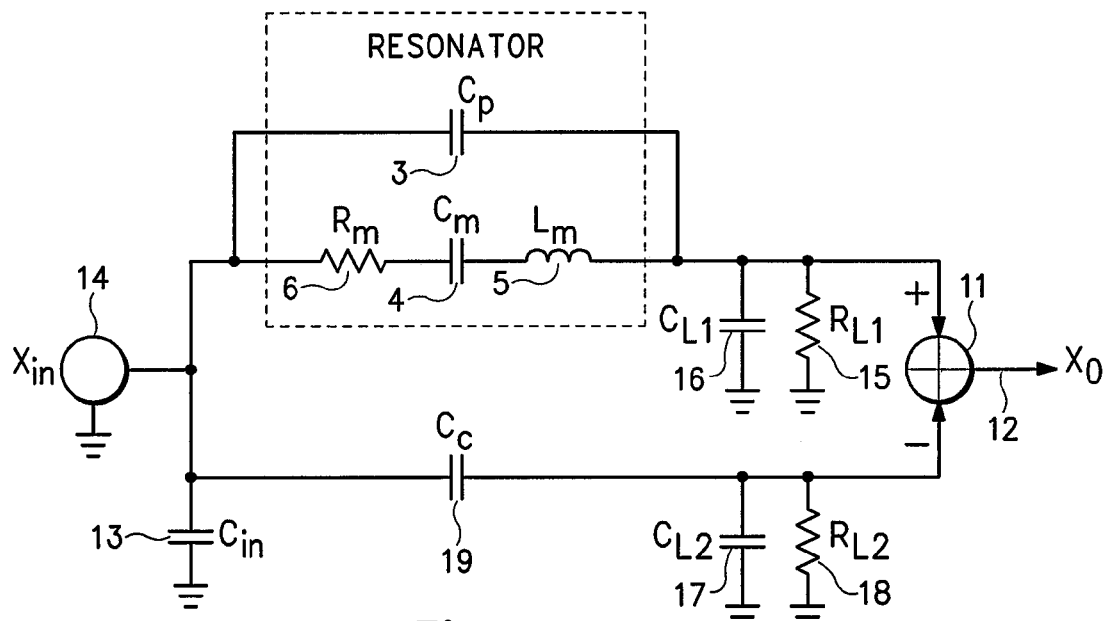
FIG. 4 is a detailed circuit diagram of the embodiment shown in FIG. 3.

FIG. 4 shows a more detailed cancellation circuit of the first embodiment. As shown, the lumped loads 9 and 10 are each replaced by a parallel circuit of a resistor and capacitor. Thus, load 9 is shown as including resistor $R_{L1}$, 15, and capacitor $C_{L1}$, 16. Likewise, load 10 includes resistor $R_{L2}$, 18, and capacitor $C_{L2}$, 17. In this arrangement, the cancellation network is merely a capacitor $C_c$, 19. The resonator 7 includes the equivalent circuit such as shown in FIG. 2. In order for the anti-resonance to be cancelled, it is necessary for the following conditions to be met:

$C_p = C_c$, $R_{L1} = R_{L2}$ and $C_{L1} = C_{L2}$.

The presence of the parasitic capacitance 13 at the input node has no effect on the cancellation of the anti-resonance.

Figure 6:
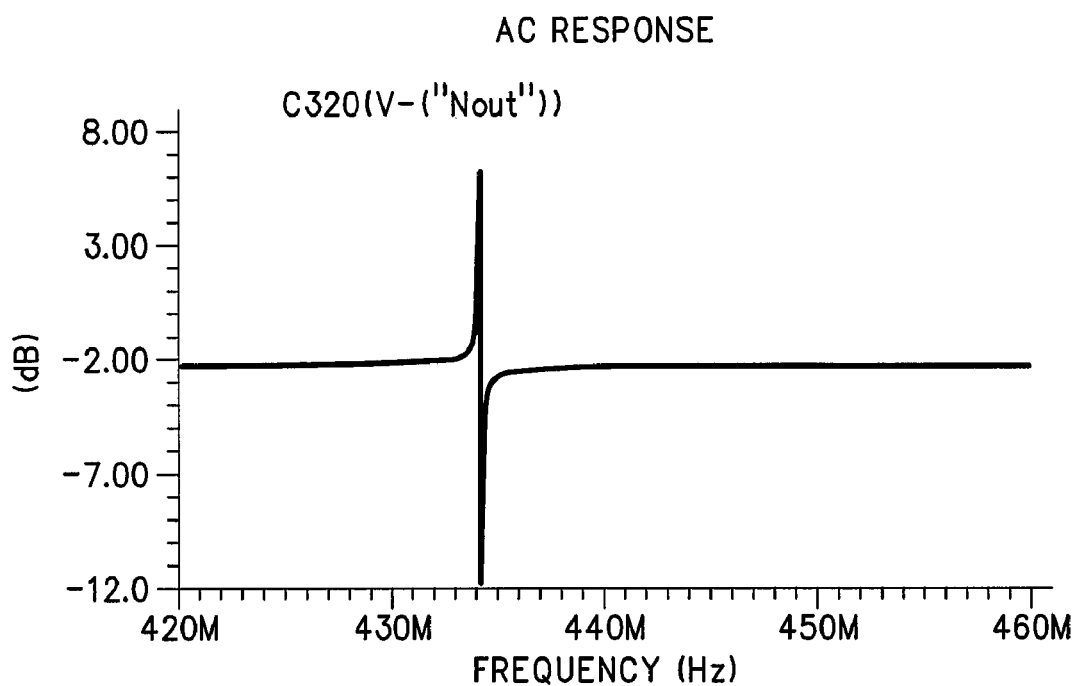
FIG. 6 is a graph of a frequency response for a resonator according to the prior art.
Figure 7:
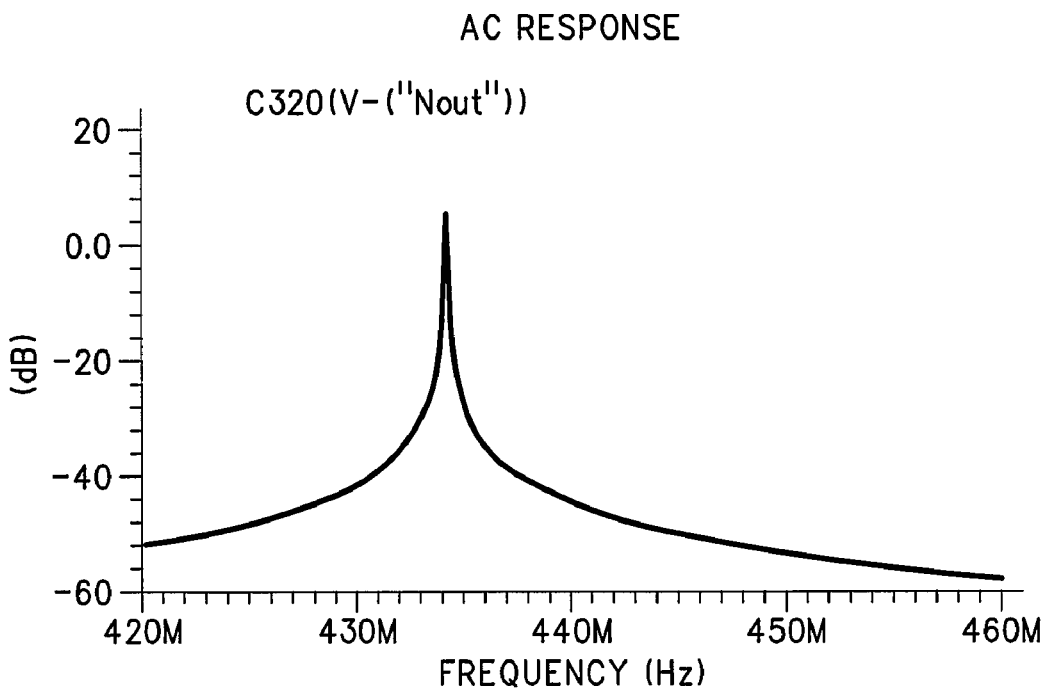
FIG. 7 is a graph of a frequency response for a resonator according to the present invention.

When these specific relationships are true, the output of the cancellation circuit is applied to the subtracting input of subtractor 11 to remove the anti-resonance part of the output curve from the resonator. Thus, by matching the parameters of the cancellation circuit to the parameters of various parts of the resonator part of the circuit, a signal is produced in the cancellation network which follows the anti-resonance signal. When this is subtracted from the output of the resonator, the anti-resonance part of the output is removed leaving the resonance part of the signal without having any anti-resonance. Thus, the output signal shown in FIG. 6 which corresponds to the output of the resonator is then changed in the subtractor to produce an output such is shown in FIG. 7 which does not include an anti-resonance.

Figure 5:
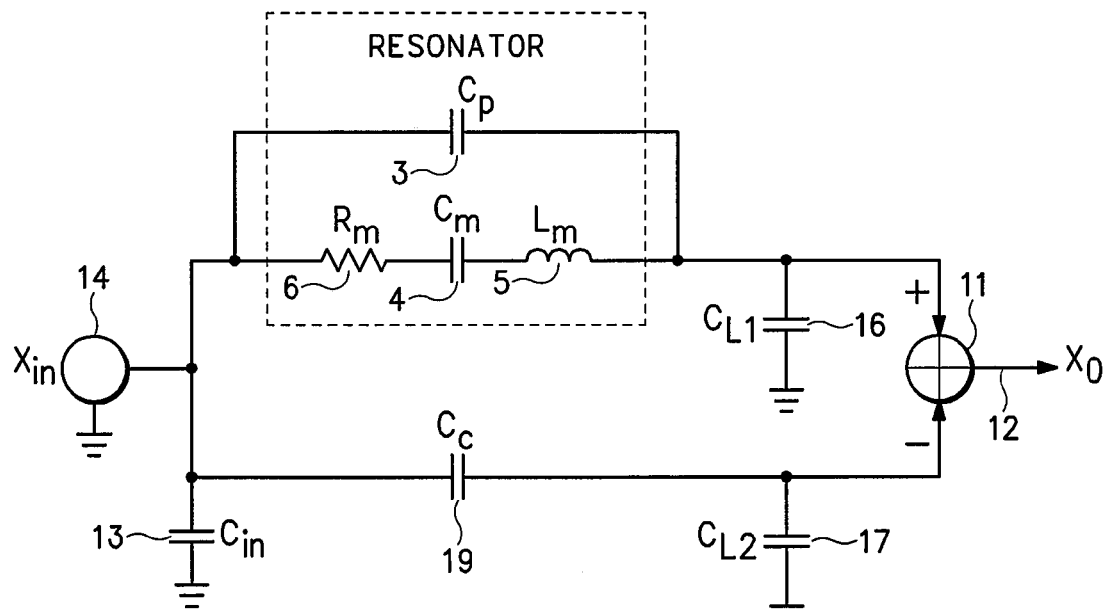
FIG. 5 is a detailed circuit diagram of the second embodiment of the present invention.

FIG. 5 shows a second embodiment where the lumped loads 9 and 10 are purely capacitive and thus, are indicated by capacitors $C_{L1}$, 16, and $C_{L2}$, 17. In this case, the anti-resonance cancellation can be achieved by the following simple condition:

$$\frac{C_P}{C_{L1}} = \frac{C_C}{C_{L2}}$$

In this case, it is only necessary that the ratio of capacitors $C_P$ to $C_{L1}$ be equal to that of $C_C$ to $C_{L2}$. In this situation, the result is similar to that of the first embodiment shown in FIG. 4 and described in FIGS. 6 and 7.

Numerous modifications and variations of the present invention are possible in light of the above teachings. It is therefore to be understood that within the scope of the appended claims, the invention may be practiced otherwise than as specifically described herein.

What is claimed is:

1. A resonator system, comprising:
a resonator to receive an input signal and provide a first output signal at a first output;
a cancellation network to receive said input signal and provide a second output signal at a second output;
a subtractor having a positive input connected to said first output and a negative input connected to said second output to combine said first and second output signals and cancel at least a portion of an anti-resonance from said first output signal;
a first load comprising a first load capacitor connected to said first output; and
a second load comprising a second load capacitor connected to said second output.

2. The resonator system according to claim 1, further comprising a capacitor to provide an input capacitance to said resonator and said cancellation network.

3. The resonator system according to claim 1, wherein said resonator receives said input signal at a first input and said cancellation network receives said input signal at a second input, and wherein said cancellation network comprises a capacitor connected between said second input and said second output.

4. The resonator system according to claim 3, wherein said capacitor of said cancellation network comprises a capacitance substantially equal to a static capacitance of said resonator, and wherein parameters of said first load and of said second load are substantially equal.

5. The resonator system according to claim 4, wherein said first load includes only the first load capacitor and said second load includes only the second load capacitor, with a ratio of a static capacitance of the resonator to the first load capacitor substantially equaling a ratio of the capacitor of the cancellation network to the second load capacitor.

6. The resonator system according to claim 1, said capacitances of said first and second load capacitors being substantially equal.

7. The resonator system according to claim 6, wherein said first load includes a first load resistor, said second load includes a second load resistor and resistances of said first load resistor and said second load resistor are equal.

8. The resonator system according to claim 1, wherein said resonator includes a series circuit of a resistor, an inductor and a capacitor, said series circuit having a first terminal connected to an input of said resonator and having a second terminal connected to said first output of said resonator, said resonator also including a static capacitor connected in parallel with said series circuit between said first terminal and said second terminal.

9. A method for cancelling an anti-resonance signal, comprising:
receiving an input signal at an input of a resonator having an output coupled to a first load;
receiving said input signal at an input of a cancellation circuit having an output coupled to a second load; and
subtracting a first output signal at the output of said cancellation circuit from a second output signal at the output of said resonator to produce a subtractor output signal, wherein the subtractor output contains a resonance signal from said resonator, wherein a capacitance of said cancellation circuit is substantially equal to a static capacitance of said resonator.

10. The method according to claim 9, wherein said cancellation circuit comprises a capacitor.

11. A cellular telephone comprising:
a software-defined radio adapted to receive a resonance signal; and
a resonator system, said resonator system comprising:
   a resonator to receive an input signal and provide a first output signal at a first output connected to a first load;
   a cancellation network to receive said input signal and provide a second output signal at a second output connected to a second load; and
   a subtractor having a positive input connected to said first output and a negative input connected to said second output to combine said first and second output to form a subtractor output signal that includes said resonance signal.

12. The cellular telephone of claim 11, wherein said resonator system further comprises a capacitor to provide an input capacitance to said resonator and said cancellation network.

13. The cellular telephone of claim 11, wherein said resonator receives said input signal at a first input and said cancellation network receives said input signal at a second input, and wherein said cancellation network comprises a capacitor connected between said second input and said second output.

14. The cellular telephone of claim 13, wherein said capacitor of said cancellation network comprises a capacitance substantially equal to a static capacitance of said resonator, and wherein parameters of said first load and of said second load are substantially equal.

15. The cellular telephone of claim 14, wherein said first load comprises a first load capacitor and said second load comprises a second load capacitor, said capacitances of said first and second load capacitors being substantially equal.

16. The cellular telephone according to claim 15, wherein said first load includes a first load resistor, said second load includes a second load resistor and resistances of said first load resistor and said second load resistor are equal.

17. The cellular telephone according to claim 14, wherein said first load includes only a first load capacitor and said second load includes only a second load capacitor, with a ratio of a static capacitance of the resonator to the first load capacitor substantially equaling a ratio of the capacitor of the cancellation network to the second load capacitor.

18. The cellular telephone resonator system according to claim 11, wherein said resonator includes a series circuit of a resistor, an inductor and a capacitor, said series circuit having a first terminal connected to an input of said resonator and having a second terminal connected to said first output of said resonator, said resonator also including a static capacitor connected between said first terminal and said second terminal.

* * * * *